United States Patent
Oh et al.

(10) Patent No.: US 8,260,167 B2
(45) Date of Patent: Sep. 4, 2012

(54) HIGH-VOLTAGE POWER SUPPLY

(75) Inventors: Chul-woo Oh, Suwon-si (KR); Joong-gi Kwon, Gunpo-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 541 days.

(21) Appl. No.: 12/406,160

(22) Filed: Mar. 18, 2009

(65) Prior Publication Data

US 2010/0020510 A1 Jan. 28, 2010

(30) Foreign Application Priority Data

Jul. 24, 2008 (KR) .................................. 2008-72444

(51) Int. Cl.
*G03G 15/00* (2006.01)
(52) U.S. Cl. ........................................................ 399/88
(58) Field of Classification Search ............... 399/88; 361/748, 792
See application file for complete search history.

(56) References Cited

U.S. PATENT DOCUMENTS 7,403,741 B2 * 7/2008 Yoshihara et al. ............ 399/411
2004/0131378 A1 * 7/2004 Hattori et al. ................... 399/90

FOREIGN PATENT DOCUMENTS

JP 8-84472 3/1996
JP 2006-59875 3/2006

* cited by examiner

*Primary Examiner* — Walter L Lindsay, Jr.
*Assistant Examiner* — Barnabas Fekete
(74) *Attorney, Agent, or Firm* — Staas & Halsey LLP (57) ABSTRACT

Provided is a high-voltage power supply including a board having at least one bent portion separating a first region of the board from a second region of the board, the first region not being coplanar with the second region of the board; a first circuit, on the first region of the board, generating a second voltage according to a first voltage; and a second circuit, on the second region of the board, amplifying the second voltage and then rectifying the amplified second voltage.

21 Claims, 5 Drawing Sheets

HIGH-VOLTAGE POWER SUPPLY

CROSS-REFERENCE TO RELATED APPLICATION

This application claims the benefit of Korean Patent Application No. 2008-72444, filed Jul. 24, 2008, in the Korean Intellectual Property Office, the disclosure of which is incorporated herein by reference.

BACKGROUND OF THE INVENTION

1. Field of the Invention

Aspects of the present general inventive concept relate to a power supply and more particularly, to a high-voltage power supply which generates a high-voltage signal by using a low-voltage signal.

2. Description of the Related Art

An image forming apparatus, such as a laser beam printer (LBP), includes a plurality of devices that electronically operate. Examples of the plurality of devices included in the image forming apparatus include a device for charging a surface of a photoconductive drum, a device for forming an electrostatic latent image on the surface of the photoconductive drum, and a device for transferring the electrostatic latent image onto a printing medium. Power sources for each of the plurality of devices may be different, and are a direct current (DC) high-voltage signal, such as DC 1000 V, equal to or above a predetermined voltage. However, an alternating current (AC) voltage, such as a home AC voltage of 220 Vrms (Volts root mean square) is supplied to the image forming apparatus after being converted to a predetermined DC low-voltage signal, such as DC 5 V, and thus the image forming apparatus includes a high-voltage power supply that generates a plurality of high-voltage signals by receiving a low-voltage signal.

Such a high-voltage power supply is one flat board including a circuit for generating a plurality of high-voltage signals by receiving one low-voltage signal. Here, contacts in the board, specifically, contacts grounded to a contact to which a high-voltage signal is applied, should be spaced apart from each other so as to prevent a spark between the contacts. Accordingly, it is difficult to reduce the size of the board, and thus difficult to apply a conventional high-voltage power supply to small home appliances. The number of circuits arranged on the board of the high-voltage power supply increases as the number of high-voltage signals generated by using one low-voltage signal increases.

SUMMARY OF THE INVENTION

Aspects of the present general inventive concept provide a high-voltage power supply having a small size, and an electronic device, such as an image forming apparatus, including the high-voltage power supply.

According to an aspect of the present general inventive concept, there is provided a high-voltage power supply including: a board having at least one bent portion separating a first region of the board from a second region of the board, the first region not being coplanar with the second region of the board; a first circuit, on the first region of the board, generating a second voltage according to a first voltage; and a second circuit, on the second region of the board, amplifying the second voltage and then rectifying the amplified second voltage.

According to another aspect of the present general inventive concept, there is provided an image forming apparatus including: a charging unit uniformly charging a surface of a photoconductive drum; a light exposing unit performing light exposure on the surface of the photoconductive drum to form an electrostatic latent image; a developing unit developing the electrostatic latent image using a developer; a transferring unit transferring the developed electrostatic latent image onto a printing medium; a fusing unit fusing the transferred developed electrostatic latent image onto the printing medium; a cleaning unit removing the developer remaining on the photoconductive drum; and a high-voltage power supply supplying power to the charging unit, the light exposing unit, the developing unit, the transferring unit, the fusing unit, and the cleaning unit, wherein the high-voltage power supply includes: a board having at least one bent portion separating a first region of the board from a second region of the board, the first region not being coplanar with the second region of the board; a first circuit, on the first region of the board, generating a second voltage according to a first voltage; and a second circuit, on the second region of the board, amplifying the second voltage and then rectifying the amplified second voltage.

According to another aspect of the present general inventive concept, there is provided an electronic device including: electronic components receiving power; and a high-voltage power supply supplying power, wherein the high-voltage power supply includes: board having at least one bent portion separating a first region of the board from a second region of the board, the first region not being coplanar with the second region of the board; a first circuit, on the first region, generating a second voltage according to a first voltage; and a second circuit, on the second region, amplifying the second voltage and then rectifying the amplified second voltage.

Additional aspects and/or advantages of the present general inventive concept will be set forth in part in the description which follows and, in part, will be obvious from the description, or may be learned by practice of the general inventive concept.

BRIEF DESCRIPTION OF THE DRAWINGS

These and/or other aspects and advantages of the general inventive concept will become apparent and more readily appreciated from the following description of the embodiments, taken in conjunction with the accompanying drawings of which.

DETAILED DESCRIPTION OF THE EMBODIMENTS

Reference will now be made in detail to the present embodiments of the present general inventive concept, examples of which are illustrated in the accompanying drawings, wherein like reference numerals refer to the like elements throughout. The embodiments are described below in order to explain the present general inventive concept by referring to the figures.

Figure 1:
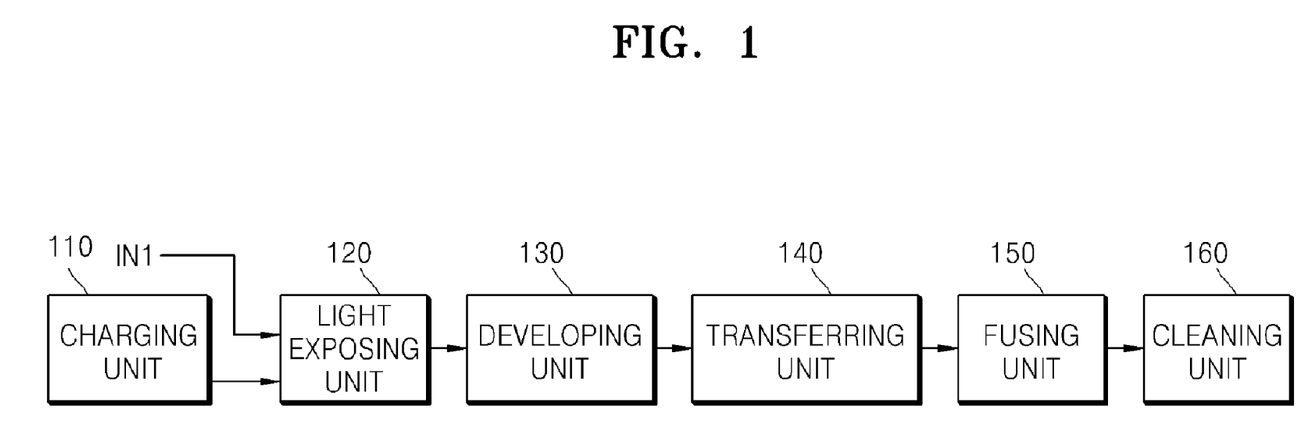
FIG. 1 is a block diagram illustrating an image forming apparatus including a high-voltage power supply, according to an embodiment of the present general inventive concept.

FIG. 1 is a block diagram illustrating an image forming apparatus including a high-voltage power supply, according to an embodiment of the present general inventive concept. Referring to FIG. 1, the image forming apparatus includes a charging unit 110, a light exposing unit 120, a developing unit 130, a transferring unit 140, a fusing unit 150, and a cleaning unit 160.

Here, the image forming apparatus denotes a device having a printing function, such as a multi-function peripheral (MFP) having a printing function. A one-color laser beam printer and a color laser beam printer are examples of such an image forming apparatus.

The charging unit 110 uniformly charges the entire surface of a photoconductive drum (not shown) included in the image forming apparatus with a uniform polarity.

Then, the light exposing unit 120 performs light exposure on the surface of the photoconductive drum considering printing data received through an input terminal IN1 of the light exposing unit 120, thereby forming an electrostatic latent image corresponding to the printing data on the surface of the photoconductive drum. Here, the electrostatic latent image has a uniform polarity, such as "+".

The developing unit 130 generates a developed image by developing the electrostatic latent image formed on the surface of the photoconductive drum by using a developer, such as toner. Here, the developer has a uniform polarity, such as "−".

The transferring unit 140 transfers the developed electrostatic latent image formed on the surface of the photoconductive drum by the developing unit 130 onto a printing medium. Here, the printing medium denotes a medium on which the developed image is to be printed, and a material of the printing medium may vary, such as a paper or an overhead projector (OHP) film.

The fusing unit 150 fuses the developed electrostatic latent image transferred onto the printing medium by the transferring unit 140 onto the printing medium. In detail, the fusing unit 150 fuses the developed electrostatic latent image onto the printing medium by using heat and pressure.

The cleaning unit 160 starts to operate after the operation of the fusing unit 150 is completed, and removes the developer left on the surface of the photoconductive drum. All of the developer on the surface of the photoconductive drum should be transferred to the printing medium, but in reality, some developer may be left on the surface of the photoconductive drum after a transferring operation. The developer left on the surface of the photoconductive drum, after the operation of the transferring unit 140 is completed, with respect to an nth piece of printing data (wherein n is a natural number) received through the input terminal IN1 may deteriorate the printing quality of printed matter of an n+1th piece of printing data, and thus may be completely removed by the cleaning unit 160 before the light exposing unit 120 starts to operate for the n+1th piece of printing data.

Each of the charging unit 110, the light exposing unit 120, the developing unit 130, the transferring unit 140, the fusing unit 150, and the cleaning unit 160 electronically operates by receiving power from a power source. Here, the power source applied to each of the charging unit 110, the light exposing unit 120, the developing unit 130, the transferring unit 140, the fusing unit 150, and the cleaning unit 160 may be different and a direct current (DC) high-voltage signal equal to or above a uniform voltage, such as a DC 1000 V. However, an alternating current (AC) voltage, such as a home AC voltage of 220 Vrms, is converted to a predetermined DC low-voltage signal, such as DC 5 V, and supplied to the image forming apparatus. Accordingly, the image forming apparatus includes a high-voltage power supply that generates a plurality of high-voltage signals by receiving a low-voltage signal. Additionally, a high-voltage power supply may be used to supply power to other electronic devices having electronic components using DC high-voltage power signals, such as computers, telecommunications devices, radio transmission devices, televisions, electronic visual displays, home electronic appliances and other such electronic devices. A high-voltage power supply according to several embodiments of the present general inventive concept will now be described.

Figure 2:
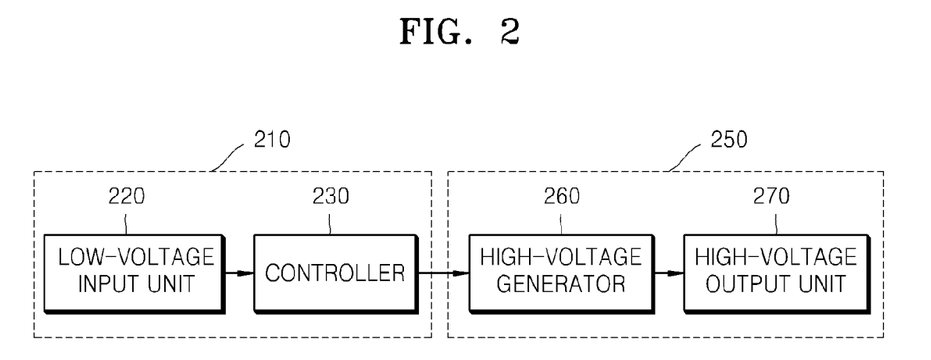
FIG. 2 is a block diagram illustrating a high-voltage power supply according to an embodiment of the present general inventive concept.

FIG. 2 is a block diagram illustrating a high-voltage power supply according to an embodiment of the present general inventive concept. The high-voltage power supply includes a first circuit 210 and a second circuit 250. The first circuit 210 includes a low-voltage input unit 220 and a controller 230, and the second circuit 250 includes a high-voltage generator 260 and a high-voltage output unit 270.

The low-voltage input unit 220 receives a first voltage. The controller 230 generates a second voltage according to the received first voltage. Here, the first voltage denotes the DC low-voltage signal transmitted to the image forming apparatus, such as DC 5 V, and the second voltage denotes the AC low-voltage determined according to the first voltage, such as DC 18 Vrms. Here, a relationship between the first and second voltages is predetermined. For this, the controller 230 may include an oscillating circuit.

The high-voltage generator 260 amplifies the second voltage with a predetermined gain, and rectifies the amplified second voltage. Here, the rectified second voltage is a DC high-voltage signal, i.e., a DC voltage equal to or above a predetermined voltage, such as 800 V. Since the rectified second voltage may include an alternating component (vibration), the high-voltage generator 260 may include an electrolyte condenser that flattens the rectified second voltage. However in the following embodiments, it is assumed that the high-voltage generator 260 does not include the electrolyte condenser for convenience of description.

Meanwhile, the high-voltage generator 260 may amplify the second voltage with a plurality of different gains, and generate a plurality of DC high-voltages by rectifying the amplified second voltage with different gains. The plurality of DC high-voltage signals may be power sources for each of devices that electronically operate in an image forming apparatus. For example, the high-voltage generator 260 may amplify the second voltage, such as 18 Vrms, with a plurality of different gains, and generate a DC high-voltage signal of −300 V, a DC high-voltage signal of −1200 V, and a DC high-voltage signal of +1300 V by rectifying the amplified second voltages with different gains. Then, the DC high-voltage signal of −1200 V may be supplied to the charging unit 110 of FIG. 1 as the power source of the charging unit 110, the DC high-voltage signal of −300 V may be supplied to the developing unit 130 of FIG. 1 as the power source of the developing unit 130, and the DC high-voltage signal of +1300 V may be supplied to the transferring unit 140 of FIG. 1 as the power source of the transferring unit 140.

The high-voltage output unit 270 outputs the plurality of high-voltage signals generated by the high-voltage generator 260 via a plurality of output terminals.

The first circuit 210 is on a first region (not shown) of a board that has a bent region and the second circuit 250 on a second region (not shown) of the board. According to aspects of the present general inventive concept, a board having a bent region may denote one board having at least one curved or bent region, a plurality of plane boards or regions that are one plane board by connecting at least one part of the plane boards or regions to each other so that one end of a plane board or region is connected to another end of another plane board or region at a predetermined angle, or combinations thereof. The latter boards are used for convenience of description. The plurality of planes or regions may be electrically connected.

The board having a bent region, for example, a board having a double open sided box shape, may include a plurality of planes or regions, such as a first rectangular plane or region having an area A, a second rectangular plane or region having an area 2A and connected to the first plane or region, and a third rectangular plane or region having an area A and connected to the second plane or region, wherein A is a positive number. Here, an area of the board on which the second circuit 250 is disposed, for example, an area of the second plane or the second region, may be larger than an area of the board on which the first circuit 210 is disposed, such as an area of the first plane or the first region. However, an arrangement of the first and second circuits 210 and 250 on the board is not limited thereto, and may vary. While not required, a further circuit can be disposed on the third region or the third plane.

The first and second circuits 210 and 250 may be one module, for example, in one integrated chip.

Also, at least one region of the board may be covered with an insulator. In detail, at least one part of the board, the first circuit 210, and the second circuit 250 may be prepared in a case, and a space in the case excluding the board, the first circuit 210, and the second circuit 250 may be filled with the insulator.

Figure 3:
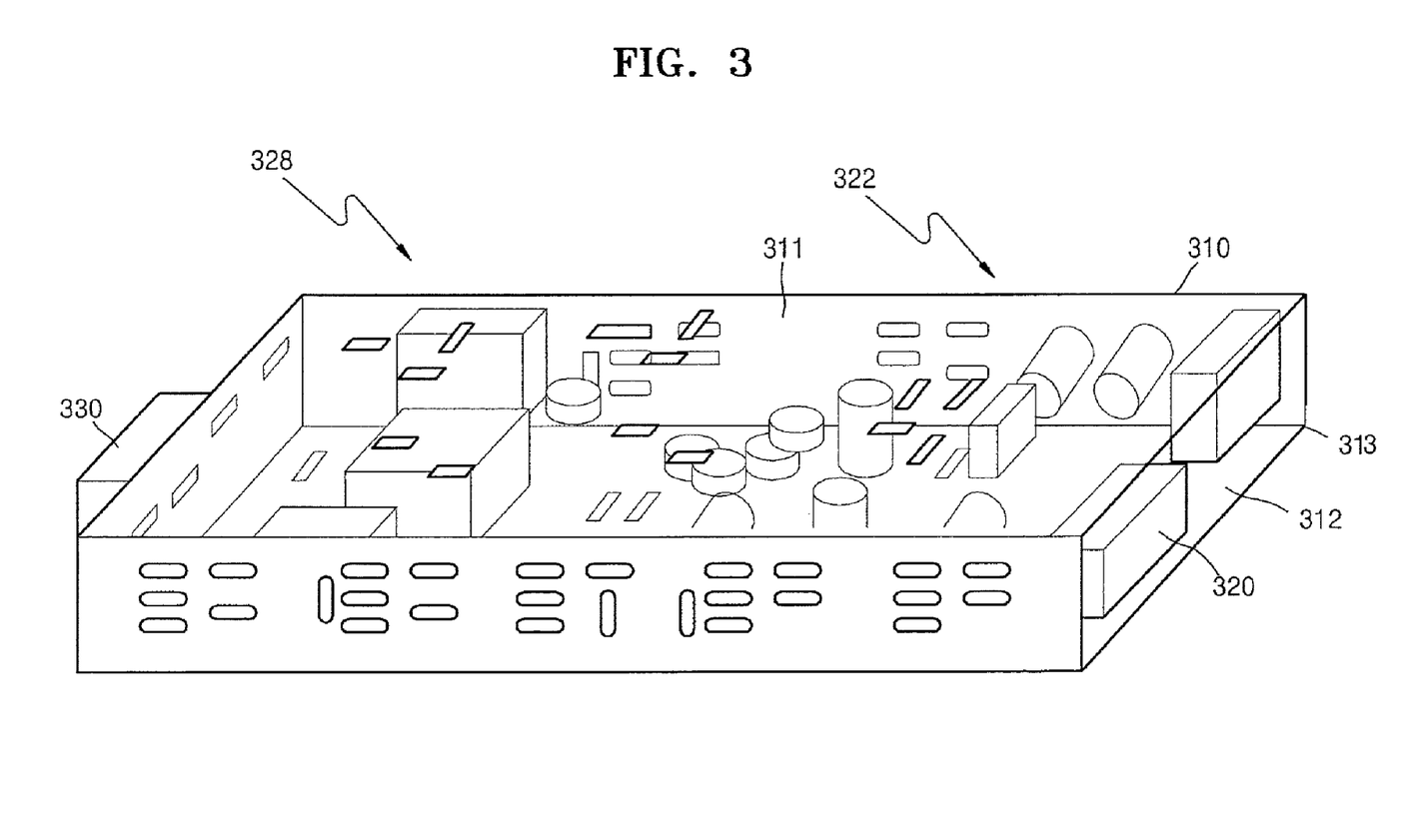
FIG. 3 is a diagram for describing a high-voltage power supply according to an embodiment of the present general inventive concept.

FIG. 3 is a schematic diagram for describing a high-voltage power supply according to an embodiment of the present general inventive concept. For convenience of description, it is assumed that a board 310 has a box shape, and a first circuit and a second circuit are on a first region 311 and a second region 312 of the board 310, respectively. The first region 311 and the second region 312 are separated by a bent region 313.

According to the current embodiment, the high-voltage power supply does not include an insulator, and the board 310 includes a low-voltage input unit 320, a controller 322, a high-voltage generator 328, and a high-voltage output unit 330.

Figure 4:
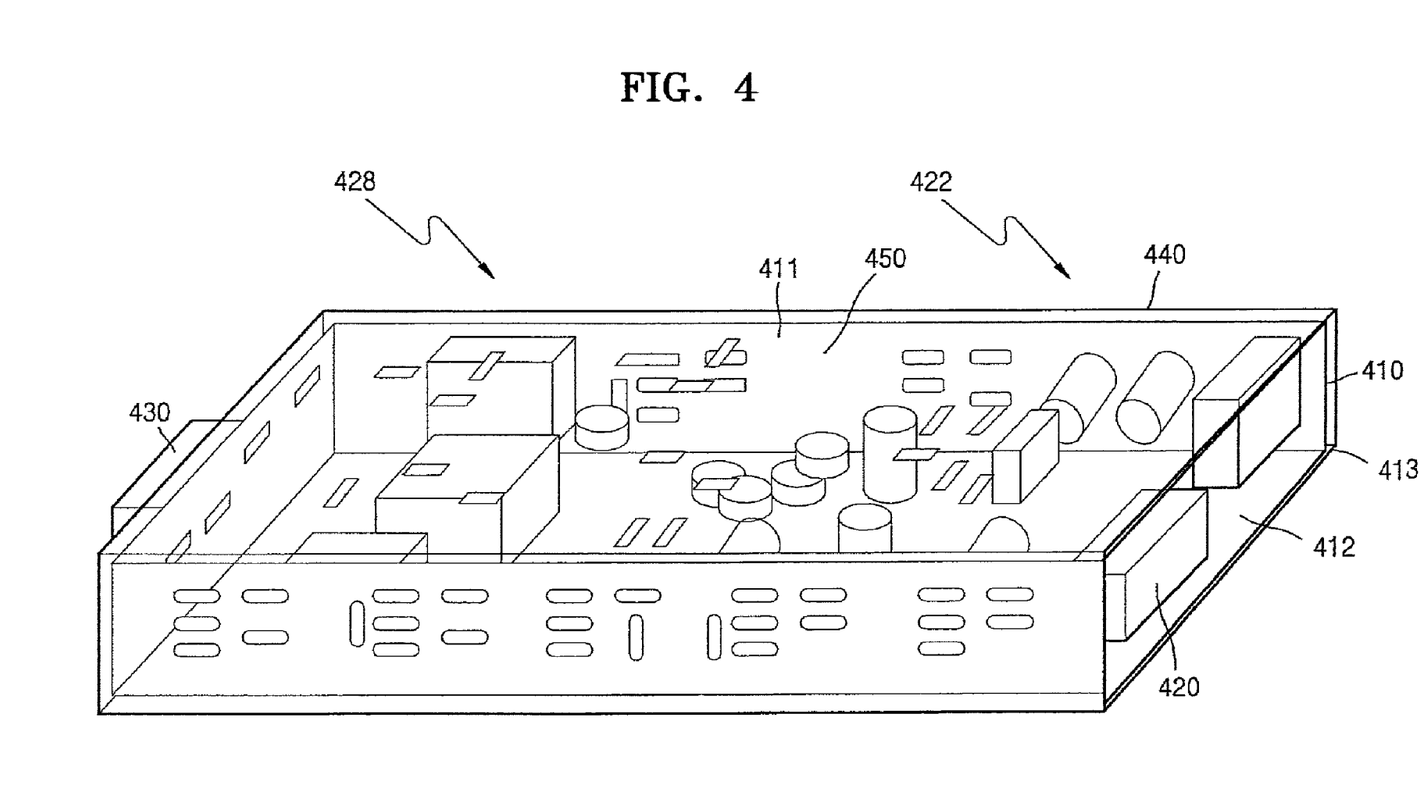
FIG. 4 is a schematic diagram for describing a high-voltage power supply according to another embodiment of the present general inventive concept.

FIG. 4 is a schematic diagram for describing a high-voltage power supply according to another embodiment of the present general inventive concept. For convenience of description, it is assumed that a board 410 has a box shape, and a first circuit and a second circuit are on the first region 411 and the second region 412 of the board 410, respectively. The first region 411 and the second region 412 are separated by a bent region 413.

According to the current embodiment, the board 410 includes a low-voltage input unit 420, a controller 422, a high-voltage generator 428, and a high-voltage output unit 430. The board 410 is prepared in a case 440, and an insulator 450 is filled in the case 440. Accordingly, a spark is prevented from being generated between contacts of the board 410, specifically, between contacts grounded to a contact to which a high-voltage signal is applied, from among the contacts of the board 410.

Since a spark is more frequently generated between contacts of a board on which a second circuit is formed than between contacts of the board on which a first circuit is formed, a following embodiment is also suggested so as to minimize the amount of an insulator and effectively prevent generation of a spark between contacts of the board.

Figure 5:
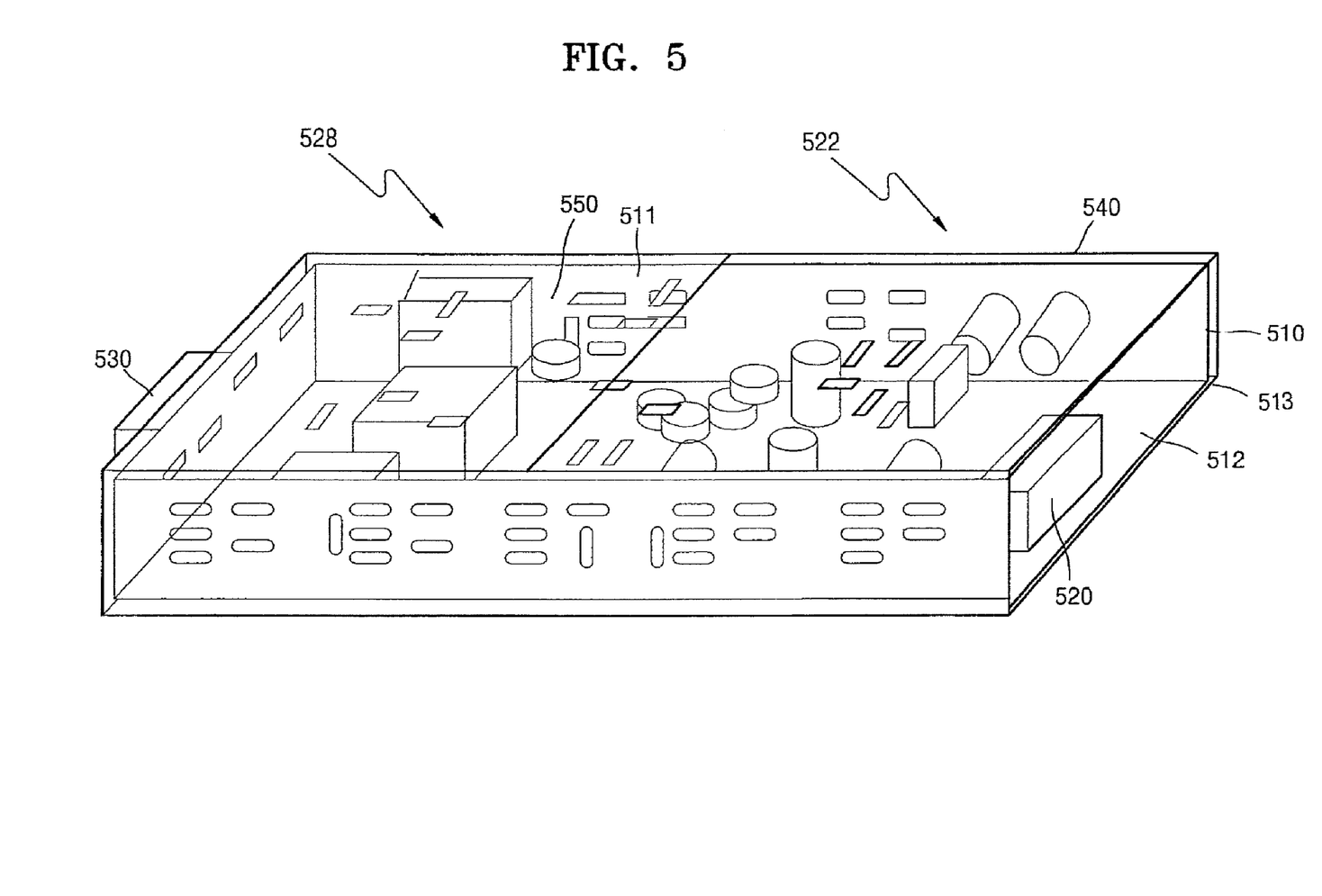
FIG. 5 is a schematic diagram for describing a high-voltage power supply according to another embodiment of the present general inventive concept.

FIG. 5 is a schematic diagram for describing a high-voltage power supply according to another embodiment of the present general inventive concept. For convenience of description, it is assumed that a board 510 has a box shape, and a first circuit and a second circuit are on the first region 511 and the second region 512 of the board 510, respectively. The first region 511 and the second region 512 are separated by a bent region 513.

According to the current embodiment, the board 510 includes a low-voltage input unit 520, a controller 522, a high-voltage generator 528, and a high-voltage output unit 530. The board 510 is prepared in a case 540, and an insulator 550 is filled only in a space between the board 510 on which a second circuit is formed and the case 540 but not filled in a space between the board 510 on which a first circuit is formed and the case 540. Accordingly, a spark is prevented from being generated between contacts of the board 510, specifically, between contacts grounded with a contact to which a high-voltage signal is applied, from among the contacts of the board 510.

In the high-voltage power supply according to the embodiments of the present general inventive concept, a first circuit, which receives a first voltage (a DC low-voltage signal) and generates a second voltage (an AC low-voltage signal) according to the first voltage, and a second circuit, which amplifies the second voltage with a predetermined gain, is on a board having a bent region (for example, a board having a box shape), instead of a flat board. Accordingly, areas of the board can be effectively used, and thus the high-voltage power supply can be minimized. Moreover, an electronic device, such as an image forming apparatus, including the high-voltage power supply can also be minimized. Additionally, other electronic devices having electronic components using DC high-voltage power signals, such as computers, telecommunications devices, radio transmission devices, televisions, electronic visual displays, home electronic appliances and other such electronic devices may be minimized. In addition, by covering the board, the first circuit, and the second circuit with an insulator or by covering an area of the board on which the second circuit is formed and the second circuit with the insulator, a spark does not generate in contacts of the board that are covered by the insulator. Accordingly, the contacts of the board do not need to be spaced apart from each other so as to prevent the spark, and thus the high-voltage supply can be minimized by more tightly integrating the first and second circuits.

Although a few embodiments of the present general inventive concept have been shown and described, it would be appreciated by those skilled in the art that changes may be made in this embodiment without departing from the principles and spirit of the present general inventive concept, the scope of which is defined in the claims and their equivalents.

What is claimed is:
1. An image forming apparatus comprising:
  a charging unit uniformly charging a surface of a photoconductive drum;
  a light exposing unit performing light exposure on the surface of the photoconductive drum to form an electrostatic latent image;
  a developing unit developing the electrostatic latent image using a developer;
  a transferring unit transferring the developed electrostatic latent image onto a printing medium;
  a fusing unit fusing the transferred developed electrostatic latent image onto the printing medium;
  a cleaning unit removing the developer remaining on the photoconductive drum; and
  a high-voltage power supply supplying power to the charging unit, the light exposing unit, the developing unit, the transferring unit, the fusing unit, and the cleaning unit, wherein the high-voltage power supply comprises:
- a board having at least one bent portion separating a first region of the board from a second region of the board, the first region of the board not being coplanar with the second region of the board;
- a first circuit, on the first region of the board, generating a second voltage according to a first voltage; and
- a second circuit, on the second region of the board, amplifying the second voltage and then rectifying the amplified second voltage.

2. The image forming apparatus of claim 1, wherein the first and second regions are geometric planes connected to each other by having an end of one plane connected to an end of another plane.

3. The image forming apparatus of claim 2, wherein the first region is connected at a predetermined angle relative to the second region.

4. The image forming apparatus of claim 2, wherein an area of the second region is larger than an area of the first region.

5. The image forming apparatus of claim 1, wherein at least one of the first region and the second region is covered with an insulator.

6. The image forming apparatus of claim 5, wherein at least one of the regions is disposed in a predetermined case and the insulator is formed therein covering the at least one of the regions disposed in a predetermined case and not covering the remaining of the regions.

7. The image forming apparatus of claim 1, wherein the first circuit and the second circuit are one module.

8. An electronic device, comprising:
electronic components receiving power; and
a high-voltage power supply supplying power, wherein the high-voltage power supply comprises:
- a board having at least one bent portion separating a first region of the board from a second region of the board, the first region of the board not being coplanar with the second region of the board;
- a first circuit, on the first region, generating a second voltage according to a first voltage; and
- a second circuit, on the second region, amplifying the second voltage and then rectifying the amplified second voltage.

9. The electronic device of claim 8, wherein the first and second regions are geometric planes connected to each other by having an end of one plane connected to an end of another plane.

10. The electronic device of claim 9, wherein the first region is connected at a predetermined angle relative to the second region.

11. The electronic device of claim 8, wherein at least one of the first region and the second region is covered with an insulator.

12. The electronic device of claim 11, wherein at least one of the regions is disposed in a predetermined case and the insulator is formed therein covering at least one of the regions disposed in the predetermined case and not covering the remaining of the regions.

13. The electronic device of claim 8, wherein the first circuit and the second circuit are one module.

14. The image forming apparatus of claim 1, wherein the board has a third region of the board that is not coplanar to the first region of the board and second region of the board.

15. The image forming apparatus of claim 14, wherein the third region is parallel to the first region of the board.

16. The image forming apparatus of claim 14, wherein at least one circuit element or the first circuit is on the third region of the board and is electrically connected to the second region of the board.

17. The image forming apparatus of claim 4, wherein the first region of the board is perpendicular to the second region of the board.

18. The image forming apparatus of claim 8, wherein the board has a third region of the board that is not coplanar to the first region of the board and second region of the board.

19. The high-image forming apparatus of claim 18, wherein the third region is parallel to the first region of the board.

20. The image forming apparatus of claim 18, wherein the first circuit is also on the third region of the board and is electrically connected to the second region of the board.

21. The image forming apparatus of claim 10, wherein the first region of the board is perpendicular to the second region of the board.

* * * * *

UNITED STATES PATENT AND TRADEMARK OFFICE
CERTIFICATE OF CORRECTION

| | | |
|---|---|---|
| PATENT NO. | : 8,260,167 B2 | Page 1 of 1 |
| APPLICATION NO. | : 12/406160 | |
| DATED | : September 4, 2012 | |
| INVENTOR(S) | : Oh et al. | |

It is certified that error appears in the above-identified patent and that said Letters Patent is hereby corrected as shown below:

In the Claims

Column 8, Line 33, in Claim 19, delete "high-image" and insert -- image --, therefor.

Signed and Sealed this
Twenty-ninth Day of July, 2014

Michelle K. Lee
*Deputy Director of the United States Patent and Trademark Office*